(12) United States Patent
Streck et al.

(10) Patent No.: US 7,544,551 B2
(45) Date of Patent: Jun. 9, 2009

(54) TECHNIQUE FOR STRAIN ENGINEERING IN SI-BASED TRANSISTORS BY USING EMBEDDED SEMICONDUCTOR LAYERS INCLUDING ATOMS WITH HIGH COVALENT RADIUS

(75) Inventors: Christof Streck, Coswig (DE); Volker Kahlert, Dresden (DE); Alexander Hanke, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 300 days.

(21) Appl. No.: 11/465,592

(22) Filed: Aug. 18, 2006

(65) Prior Publication Data
US 2007/0096194 A1    May 3, 2007

(30) Foreign Application Priority Data
Oct. 31, 2005    (DE) ........................ 10 2005 051 994

(51) Int. Cl.
*H01L 21/338* (2006.01)
(52) U.S. Cl. ..................................... 438/175
(58) Field of Classification Search .................. 257/18, 257/50, 63–66; 438/166, 175
See application file for complete search history.

(56) References Cited

U.S. PATENT DOCUMENTS

| 5,548,128 | A | * | 8/1996 | Soref et al. | .................... | 257/18 |
| 2004/0253776 | A1 | | 12/2004 | Hoffmann et al. | ........... | 438/199 |
| 2005/0009282 | A1 | | 1/2005 | Usuda et al. | ................. | 438/287 |
| 2005/0035409 | A1 | | 2/2005 | Ko et al. | ..................... | 257/350 |
| 2005/0070053 | A1 | | 3/2005 | Sadaka et al. | | |
| 2006/0163612 | A1 | * | 7/2006 | Kouvetakis et al. | ......... | 257/201 |

FOREIGN PATENT DOCUMENTS

| WO | WO 2005/006447 A1 | 1/2005 |
| WO | 2005/015609 | 2/2005 |

OTHER PUBLICATIONS

Search Report Dated Mar. 19, 2007 in Serial No. PCT/US06/041559.
"Synthesis of Metastable Group-IV Allow Semiconductors by Ion Implantation and Ion-Beam-Induced Epitaxial Crystallization" by Kobayashi, et al; Applied Surface Science; vol. 100-101; Jul. 2, 1996; pp. 498-502.
"New IR Semiconductors in the Si-Ge-Sn System" by Kouvetakis, et al; First IEEE International Conference in Hong Kong; Sep. 29-Oct. 1, 2004; pp. 55-57.
"Pseudomorphic Si1-xSnx Alloy Films Grown by Molecular Beam Epitaxy on Si" by Shiryaev, et al; Applied Physics Letters; pp. 2287-2289; vol. 67, No. 16; Oct. 16, 1995.
"Band-Edge Photoluminescence From Pseudomorphic Si0.96Sn0. 04 Alloy" by Khan, et al; Applied Physics Letters; vol. 68, No. 22, May 27, 1996; pp. 3105-2107.

* cited by examiner

*Primary Examiner*—Calvin Lee
(74) *Attorney, Agent, or Firm*—Williams, Morgan & Amerson, P.C.

(57) ABSTRACT

By incorporating an atomic species of increased covalent radius, which may at least partially substitute germanium, a highly efficient strain mechanism may be provided, in which the risk of stress relief due to germanium conglomeration and lattice defects may be reduced. The atomic species of increased radius, such as tin, may be readily incorporated by epitaxial growth techniques on the basis of tin hydride.

21 Claims, 4 Drawing Sheets

TECHNIQUE FOR STRAIN ENGINEERING IN SI-BASED TRANSISTORS BY USING EMBEDDED SEMICONDUCTOR LAYERS INCLUDING ATOMS WITH HIGH COVALENT RADIUS

BACKGROUND OF THE INVENTION

1. Field of the Invention

Generally, the present invention relates to the formation of integrated circuits, and, more particularly, to the formation of different transistor types having strained channel regions by using embedded silicon/germanium to enhance charge carrier mobility in the channel region of a MOS transistor.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most promising approach due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region upon formation of a conductive channel, due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability. In addition, the vertical location of the PN junctions with respect to the gate insulation layer also represents a critical design criterion in view of leakage current control. Hence, reducing the channel length usually also requires reducing the depth of the drain and source regions with respect to the interface formed by the gate insulation layer and the channel region, thereby requiring sophisticated implantation techniques. According to other approaches, epitaxially grown regions are formed with a specified offset to the gate electrode, which are referred to as raised drain and source regions, to provide increased conductivity of the raised drain and source regions, while at the same time maintaining a shallow PN junction with respect to the gate insulation layer.

Since the continuous size reduction of the critical dimensions, i.e., the gate length of the transistors, necessitates the adaptation and possibly the new development of highly complex process techniques concerning the above-identified process steps, it has been proposed to also enhance the channel conductivity of the transistor elements by increasing the charge carrier mobility in the channel region for a given channel length, thereby offering the potential for achieving a performance improvement that is comparable with the advance to a future technology node, while avoiding or at least postponing many of the above process adaptations associated with device scaling. One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, creating tensile strain in the channel region increases the mobility of electrons, wherein, depending on the magnitude and direction of the tensile strain, an increase in mobility of 50% or more may be obtained, which, in turn, may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

Consequently, it has been proposed to introduce, for instance, a silicon/germanium layer or a silicon/carbon layer in or below the channel region to create tensile or compressive stress that may result in a corresponding strain. Transistor performance may be considerably enhanced by the introduction of stress-creating layers in or below the channel region, and therefore significant efforts have been made to implement the formation of corresponding stress layers into the conventional and well-approved MOS technique. For instance, additional epitaxial growth techniques have been developed and implemented into the process flow to form the germanium or carbon-containing stress layers at appropriate locations in or below the channel region.

In other approaches, external stress created by, for instance, overlaying layers, spacer elements and the like is used in an attempt to create a desired strain within the channel region. However, the process of creating the strain in the channel region by applying a specified external stress may suffer from an inefficient translation of the external stress into strain in the channel region. Hence, although providing advantages in terms of process complexity over the above-discussed approach requiring additional stress layers within the channel region, the efficiency of the stress transfer mechanism may depend on the process and device specifics and may result in a reduced performance gain for one type of transistors.

In another approach, the hole mobility in PMOS transistors is enhanced by forming a strained silicon/germanium layer in the drain and source regions of the transistors, wherein the compressively strained drain and source regions create uniaxial strain in the adjacent silicon channel region. To this end, the drain and source regions of the PMOS transistors are selectively recessed, while the NMOS transistors are masked and subsequently the silicon/germanium layer is selectively formed in the PMOS transistor by epitaxial growth. This technique offers significant advantages in view of performance gain of the PMOS transistor and thus of the entire CMOS device.

Thus, strain engineering by means of embedded semiconductor materials, especially of silicon/germanium, provided as strained or relaxed layers depending on the desired effect, has proven to be a powerful means in increasing the device performance of advanced silicon-based transistors. It turns out, however, that the degree of strain induced in the respective channel regions depends on the amount of lattice mismatch between the basic silicon and the embedded semiconductor compound. For silicon/germanium, a maximum concentration of germanium for currently established epitaxial growth techniques is limited to approximately 25%, since otherwise germanium conglomeration may occur, which in turn may result in a non-desired stress relief in the corresponding embedded semiconductor compound material, thereby also reducing the strain in the respective channel region.

In view of the above-described situation, there exists a need for an improved technique that enables efficiently increasing strain by embedded semiconductor materials, while substantially avoiding or at least reducing one or more of the above-identified problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique for creating strain in specified regions of a crystalline semiconductor layer, in which a lattice mismatch between a silicon-based lattice, i.e., a lattice having a diamond-like lattice structure, and a semiconductor compound having per se an increased lattice spacing is taken advantage of for this purpose. A corresponding technology is conventionally used for creating strained silicon channels in highly advanced silicon-based MOS transistor elements, wherein, as previously explained, the amount of strain obtained by this mechanism is, among others, significantly restricted by the limited germanium concentration that may be successfully used in currently established epitaxial growth techniques. Therefore, in the present invention, additionally or alternatively to germanium, a further atomic species may be used that has a significantly increased covalent radius with respect to the boding characteristics within a silicon-like crystalline structure, thereby enabling a high degree of crystal distortion with a significantly reduced amount of non-silicon atoms in the respective silicon-based crystalline structure. In illustrative embodiments of the present invention, tin (Sn) may be used as an addition or a substitute for germanium as tin atoms have the same valence compared to silicon and germanium and also exhibit a significantly larger covalent radius.

According to one illustrative embodiment of the present invention, a transistor device comprises a substrate having formed thereon a crystalline semiconductor layer having a diamond-like crystalline structure. The crystalline semiconductor layer comprises a stress-inducing region comprised of silicon and a further atomic species having the same valence as silicon in the crystalline structure and having a covalent radius that is greater than a covalent radius of germanium. Moreover, the transistor device comprises a gate electrode formed above the crystalline semiconductor layer and a strained channel region.

According to another illustrative embodiment of the present invention, a semiconductor device comprises a crystalline semiconductor layer having a first portion comprising silicon and tin to form a first strained region in the crystalline semiconductor layer.

In accordance with still another illustrative embodiment of the present invention, a method comprises forming, in a crystalline semiconductor layer, a crystalline structure on the basis of silicon and at least one further atomic species having a covalent radius that is greater than a covalent radius of germanium. Moreover, the method comprises using the crystalline structure to create strain in a first specified region of the semiconductor layer.

BRIEF DESCRIPTION OF THE DRAWINGS

The invention may be understood by reference to the following description taken in conjunction with the accompanying drawings, in which like reference numerals identify like elements, and in which.

Figure 1A:
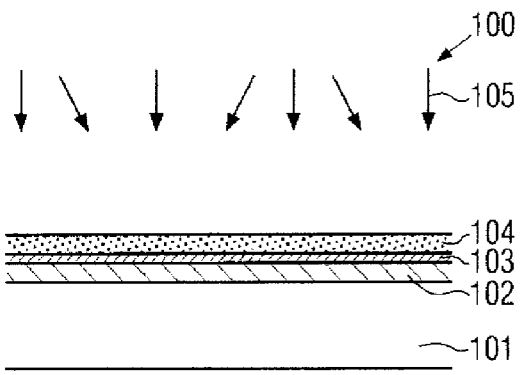
FIGS. 1a-1d schematically show cross-sectional views of a semiconductor device during various manufacturing stages in forming a strained region in a crystalline semiconductor layer on the basis of silicon and a further species that may be built into the diamond structure of silicon and has an increased covalent radius compared to germanium, according to illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention contemplates an enhanced strain-inducing mechanism by means of strained or relaxed semiconductor structures having a diamond-type lattice structure with a different lattice spacing compared to a non-strained silicon crystal. As previously explained, the mechanism of providing a strained or relaxed silicon/germanium layer within appropriate locations of a silicon-based semiconductor device provides an efficient strain engineering technique so as to correspondingly enhance the charge carrier mobility, especially within channel regions of highly advanced MOS transistor devices. These techniques rely on epitaxial growth processes, during which a strained or relaxed silicon/germanium layer may be formed, depending on the device requirements.

Moreover, recently, local selective epitaxial growth techniques have been developed which may effectively suppress a significant material deposition on dielectric surfaces, while efficiently depositing silicon, silicon/germanium and the like on exposed silicon or silicon-like surfaces. For example, if a silicon/germanium layer is deposited on a crystalline silicon layer, the silicon/germanium material may be deposited so as to have substantially the same lattice spacing as the underlying crystalline "template" so that a strained silicon/germanium layer is formed, since an undisturbed silicon/germanium crystal may have a somewhat enlarged lattice spacing compared to a pure silicon crystal. The difference in lattice spacing of a silicon/germanium layer and a silicon layer depends on the germanium concentration. Therefore, the amount of strain created in the silicon/germanium layer also depends on the germanium concentration. As previously explained, however, in currently used epitaxial growth techniques, a maximum germanium concentration may range up to approximately 25-30%, whereas a higher concentration may actually result in a germanium conglomeration, which in turn may result in an increased defect rate and thus relaxation of the initially strained silicon/germanium layer.

According to the present invention, a desired degree of lattice mismatch and thus strain may be adjusted on the basis of an atomic species having a significantly larger covalent radius compared to germanium, wherein, in some illustrative embodiments, the valence of the atomic species under consideration is substantially identical to silicon or germanium with respect to a covalent bonding structure in a diamond-like crystalline structure. In one illustrative embodiment, tin, having a covalent radius of 1.40 Å, may be used as a suitable atomic species. For example, silicon having a covalent radius of 1.17 Å may be used in combination with germanium having a covalent radius of 1.22 Å, wherein, additionally, a certain amount of tin may be incorporated to create a significantly enlarged lattice mismatch. Since the difference in covalent radius between silicon and tin is significantly higher compared to the difference in radius between silicon and germanium, a more pronounced effect on the overall lattice structure may be achieved with a reduced number of non-silicon atoms. Consequently, the germanium concentration may be kept well below a critical value of approximately 25% while an enhanced lattice mismatch may still be obtained by adding a certain amount of tin.

Furthermore, in some illustrative embodiments, silicon may be used in combination with tin, without adding any germanium, thereby providing a moderately high degree of lattice modification with a significantly reduced number of non-silicon atoms. For example, in some embodiments, it is contemplated to incorporate a certain amount of tin by other techniques such as implantation in addition or alternatively to the incorporation of tin by means of epitaxial growth. Since a reduced number of tin atoms may nevertheless significantly contribute to a lattice distortion, even atomic concentrations achievable by currently used implantation techniques may be sufficient to create a specified strain or at least to fine tune the lattice mismatch and thus the degree of strain achieved thereby. Since ion implantation is a well-established technique, which may be performed at room temperature on the basis of resist masks formed by photolithography, a corresponding incorporation of tin may be accomplished in a highly efficient and even a highly local fashion, thereby providing additional flexibility in process techniques and device design. For example, a concentration of approximately $10^{20}$ tin atoms/cm$^3$, which may be achievable by presently performed implantation techniques, may enable an efficient adjustment or control of strain in a corresponding silicon/tin or silicon/germanium/tin crystalline structure.

In the following detailed description, it may be referred to specific applications of the principles of the present invention, i.e., the incorporation of an atomic species having an enlarged covalent radius so as to create strain in a specified crystalline semiconductor region. It should be appreciated, however, that any restriction to specific transistor architectures, such as SOI-like transistors, bulk devices, transistors having raised drain and source regions and the like, are not intended unless such specific restrictions are explicitly set forth in the detailed description as well as in the appended claims.

With reference to FIGS. 1*a*-1*d*, 2*a*-2*d* and 3, further illustrative embodiments of the present invention will now be described in more detail. FIG. 1*a* schematically shows a cross-sectional view of a semiconductor device 100 at an early manufacturing stage. The semiconductor device 100 comprises a substrate 101, which may represent any appropriate substrate for carrying a semiconductor layer 102, in and on which circuit elements, such as transistors, capacitors, resistors and the like, may be formed. For example, the substrate 101 may represent a bulk semiconductor substrate, such as a silicon substrate, or may represent any insulating substrate, such as an SOI-like substrate, wherein the semiconductor layer 102 may be formed on a buried insulation layer (not shown). It should be appreciated that, although the present invention is highly advantageous in combination with highly scaled MOS transistors as are typically fabricated in advanced CMOS technologies including transistors having a gate length of 50 nm and even less, the principles of the present invention may also be applied to less critical applications so that, for existing designs, a significant performance increase may be achieved.

The semiconductor layer 102 may be a silicon-based crystalline semiconductor layer, wherein the term silicon-based is to be understood as a material layer comprising silicon with a concentration of at least atomic 50%. In illustrative embodiments, the semiconductor layer 102 may represent a doped silicon layer as is typically used for highly complex integrated circuits having transistor elements with a gate length in the above specified range. A further substantially crystalline layer 103 may be formed on the layer 102 and may represent a so-called buffer layer, in which the crystalline mismatch and thus the concentration of a specific atomic species such as germanium, tin, and the like may gradually increase to allow for the formation of a substantially relaxed stress-inducing crystalline layer 104 thereon, which may comprise at least one atomic species in combination with silicon that has a covalent radius that is greater than that of germanium. In one illustrative embodiment, the stress-inducing layer 104 may be comprised of silicon, germanium and tin, wherein a concentration of germanium may range from less than 1% to approximately 25%, while a concentration of tin may range from approximately 0.1-25%. In some embodiments, the germanium content may be selected to be well below 25%, for instance 1-10%, while the tin content may be selected within a range of approximately 0.1-10%. In still other embodiments, the stress-inducing layer 104 may be comprised of silicon and tin substantially without any germanium.

The layer 104 may represent a substantially relaxed layer having a diamond-like structure according to the crystalline template provided by the layer 102 which is transferred via the buffer layer 103 into the layer 104, wherein, however, the lattice spacing of the layer 104 may differ from that of the layer 102 depending on the concentration of germanium and tin.

The semiconductor device 100 as shown in FIG. 1a may be formed in accordance with the following processes. After providing the substrate 101, which may represent a silicon bulk substrate or an SOI substrate having formed thereon the layer 102, the thickness of which may be adapted by an epitaxial growth process, the buffer layer 103 may be formed by an epitaxial growth process 105, in which one or more non-silicon species may be deposited with varying concentrations so as to form the buffer layer 103. For example, the formation of silicon/germanium buffer layers on the basis of germanium hydride ($GeH_4$) is well established and may be used for forming the layer 103 when no additional atomic species, such as tin, is considered appropriate in the buffer layer 103. In other embodiments, the buffer layer 103 may be formed on the basis of a further atomic species such as tin, which may be accomplished by providing tin hydride ($SnH_4$) as a precursor for the epitaxial growth process 105, wherein tin hydride may be handled in a similar fashion as germanium hydride.

By appropriately depositing the material of the buffer layer 103, a corresponding lattice structure may increasingly deviate from the basic crystalline template of the layer 102 in terms of lattice spacing so that finally the layer 104 may then be deposited as a substantially unstrained, i.e., relaxed, semiconductor layer with an increased lattice spacing compared to the original lattice spacing of the layer 102. For this purpose, during the epitaxial growth process 105, a desired amount of tin and, if desired, a respective amount of germanium may be provided in combination with the silicon, which still represents the majority of the material in the layer 104. After a desired layer thickness is achieved, the epitaxial growth process 105 may be discontinued and a further epitaxial growth process may be performed so as to deposit a substantially crystalline silicon layer above the layer 104. In other embodiments, the epitaxial growth process 105 may be modified to subsequently deposit silicon, doped or undoped, depending on device requirements, wherein the substantially relaxed layer 104 acts as a crystalline template. Consequently, the silicon deposited thereon may have substantially the same crystalline structure, which represents a strained crystalline structure compared to a natural crystalline silicon layer, such as the layer 102. Consequently, a certain degree of tensile strain may be generated.

Figure 1B:
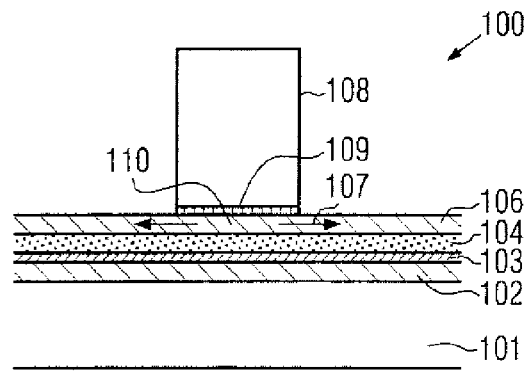

FIG. 1b schematically shows the semiconductor device 100 in a further advanced manufacturing stage. As is shown, a further crystalline silicon layer 106 is formed in the layer 104 in accordance with the above-described epitaxial growth technique. Consequently, the layer 106 exhibits intrinsic tensile strain, indicated as 107, thereby efficiently modifying the charge carrier mobility in the layer 106. Moreover, a gate electrode 108 is formed above the layer 106 and is separated therefrom by a gate insulation layer 109. The gate electrode 108 in combination with the gate insulation layer 109 defines a channel region 110 within the layer 106, which, as previously explained, exhibits the tensile strain 107, thereby increasing, for instance, the mobility of electrons in the channel region 110. Consequently, the performance of a corresponding transistor element including the gate electrode 108 and the channel region 110 may be significantly enhanced, wherein the degree of tensile strain 107 may be efficiently adjusted and controlled on the basis of the epitaxial growth process 105. Consequently, by means of the stress-inducing layer 104, an efficient strain-creating mechanism may be provided for generating tensile strain in the silicon-based layer 106.

Figure 1C:
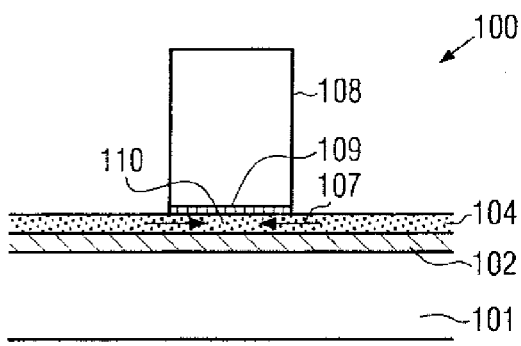

FIG. 1c schematically shows the semiconductor device 100 in accordance with another illustrative embodiment, in which compressive strain may be generated in a specified region of a crystalline semiconductor layer. In this embodiment, the stress-inducing layer 104 may be directly formed on the crystalline layer 102, which again acts as a crystalline template during the epitaxial growth process 105, which may now have been configured such that the layer 104 is itself grown as a substantially strained layer, since the crystalline structure of the layer 102 is substantially maintained within the layer 104, thereby reducing its natural lattice spacing so that the channel region 110 may be a compressively strained region, thereby modifying the mobility of holes, which may be advantageous in forming a P-channel transistor on the basis of the channel region 110 and the gate electrode 108.

Thereafter, starting from the device 100 as shown in FIG. 1b or in FIG. 1c, the further manufacturing process may be continued on the basis of well-established techniques for forming MOS transistors, which will be described in more detail later on with reference to FIGS. 2a-2d.

As previously explained, a moderately low concentration of the atomic species having the increased covalent radius may suffice so as to modify a corresponding lattice mismatch required for the generation of compressive or tensile strain, as is explained with reference to FIGS. 1a-1c. Thus, in some illustrative embodiments, additionally or alternatively to the epitaxial growth process 105, other techniques for incorporating the atomic species, such as diffusion and implantation, may be used. For example, an implantation process may be performed to introduce, for instance, tin atoms into the layer 104, thereby increasing the corresponding concentration and thus the induced strain.

Figure 1D:
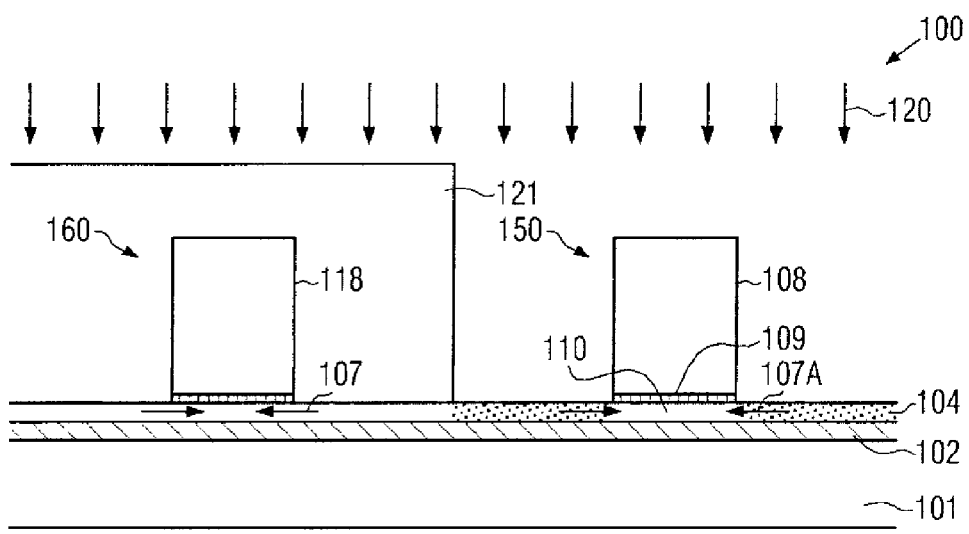

FIG. 1d schematically shows an illustrative embodiment in which the semiconductor device 100 comprises a first device region 150, in which the gate electrode 108 may be formed, while, in a second device region 160, a second gate electrode 118 may be formed on a second gate insulation layer 119, wherein the second device region 160 may be covered by an implantation mask 121, which may be provided in the form of a resist mask. Moreover, the semiconductor device 100 is subjected to an ion implantation 120 for introducing tin in a local fashion. For example, in the embodiment shown, it may be assumed that the layer 104 has been formed by the epitaxial growth process 105, as explained with reference to FIG. 1c, thereby providing the layer 104 with an intrinsic strain 107. By further implanting tin ions in the vicinity of the gate electrode 108, the corresponding tin concentration may be increased, wherein a high dose, such as $10^{16}$ to $10^{17}$ ions/cm$^2$ may be used to provide a moderately high additional concentration of tin atoms within the layer 104. The implantation parameters of the process 120 may be selected on the basis of well-established simulation models in order to obtain an implantation energy for substantially depositing the tin ions within the layer 104 without unduly damaging the "template layer" 102.

After the completion of the implantation process 120, the resist mask 121 may be removed and the device 100 may be subjected to an anneal process for re-crystallizing damaged portions in the layer 104 and for substantially placing the implanted species at lattice sites to rebuild the strained lattice in the layer 104. Due to the increased tin concentration in the vicinity of the channel region 110, an even increased compressive strain may be generated therein, thereby also causing a more efficient modification of the charge carrier mobility.

It should be appreciated that the above-described embodiment is only of an illustrative nature and a variety of modifications may be considered. For instance, the implantation process 120 may be performed prior to the formation of the gate electrodes 108 and 118 on the basis of the mask 121, so that the entire exposed portion of the layer 104 may receive the increased tin contents. In still other illustrative embodiments, the epitaxial growth process 105 may be omitted when the tin concentration incorporated by the implantation process 120 is considered sufficient for generating the desired degree of strain 107. In still other illustrative embodiments, the epitaxial growth process 105 may be performed on the basis of silicon and germanium and the implantation process 120 may be used to locally introduce tin atoms, thereby providing a means for fine tuning the finally obtained strain. For example, the first and second device regions 150, 160 may represent regions for different transistor types or may represent different die regions, in which a different degree of strain is required. For instance, in highly sensitive device regions of complex microprocessors, such as static RAM areas, none or a significantly reduced strain may be desirable, while, in logic areas, such as a CPU core, an increased degree of stress may be preferable to enhance operating speed of the CPU core. Consequently, due to the enhanced effect of the atomic species, such as tin, having the increased covalent radius, on the crystalline structure, a concentration achievable by implantation techniques may be appropriate so as to locally adjust the strain.

With reference to FIGS. 2a-2d, further illustrative embodiments of the present invention will now be described in more detail in which an embedded strained semiconductor material is formed in drain and source regions of a transistor element to induce a corresponding strain in the adjacent channel region.

Figure 2A:
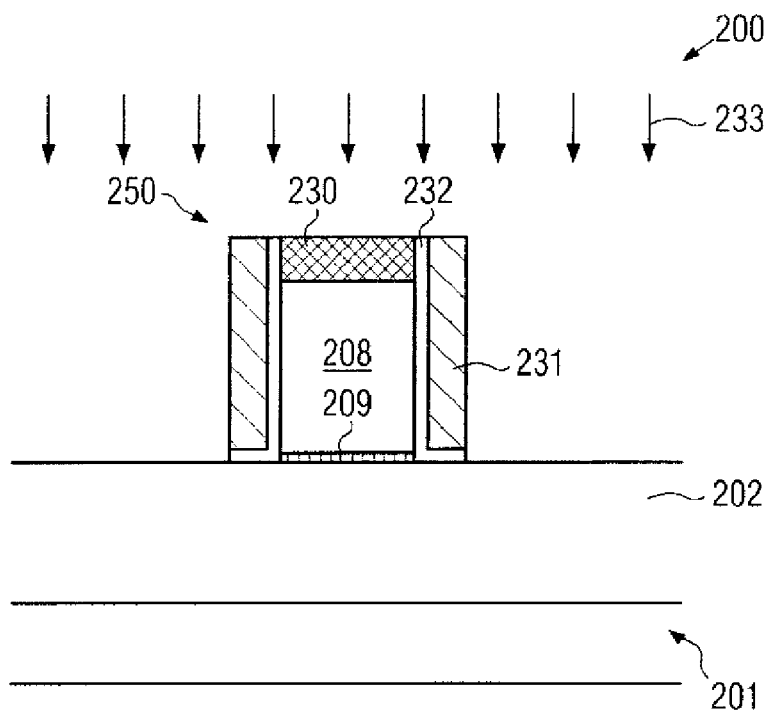
FIGS. 2a-2d schematically show cross-sectional views during various manufacturing stages in forming a transistor device receiving an embedded strained semiconductor region for creating compressive strain in a respective channel region in accordance with further illustrative embodiments of the present invention.

FIG. 2a schematically shows in a cross-sectional view a semiconductor device 200 comprising a substrate 201 having formed thereon a crystalline semiconductor layer 202. The substrate 201 may represent a bulk silicon substrate or an SOI-like substrate, i.e., the substrate 201 may have formed thereon a buried insulating layer (not shown) above which is formed the crystalline semiconductor layer 202. The semiconductor layer 202 may represent a silicon-based layer, i.e., the layer 202 may at least comprise approximately 50% silicon. Moreover, a transistor element 250 at an early manufacturing stage may be formed in and above the crystalline semiconductor layer 202. In this stage, a gate electrode 208 may be formed above the layer 202 and may be comprised of doped polysilicon, or any other appropriate material may be provided above the layer 202 and may be separated therefrom by a gate insulation layer 209. It should be appreciated that other approaches and transistor architectures may also be used in combination with the present invention, in which, for example, the gate electrode 208 may represent a replacement or dummy gate electrode, which may be removed in a later stage of manufacture to provide a conductive material of enhanced electrical characteristics. The gate electrode 208 may be "encapsulated" by a capping layer 230 and respective spacer elements 231, which may be separated from the gate electrode 208 by a respective liner 232. For instance, the capping layer 230 and the spacer 231 may be comprised of any appropriate dielectric material, such as silicon nitride, silicon oxynitride and silicon dioxide, which may be used as an etch and growth mask in an etch process and an epitaxial growth process for the formation of an embedded strained semiconductor region. The liner 232 is typically formed of a material having a high etch selectivity with respect to the spacer 231. For instance, a combination of silicon dioxide and silicon nitride for the liner 232 and the spacer 231 may be efficiently used on the basis of well-established etch recipes.

The semiconductor device 200 as shown in FIG. 2a may be formed in accordance with the following processes. After manufacturing the substrate 201, which may include advanced wafer bond techniques or other methods of forming a buried insulation layer, if SOI-like substrates are considered, the gate electrode 208 and the gate insulation layer 209 may be formed by deposition and/or oxidation for forming an appropriate gate insulation material, followed by the deposition of an appropriate gate electrode material. Thereafter, advanced lithography and etch techniques may be applied in accordance with well-established recipes to pattern the corresponding layers, thereby forming the gate electrode 208 and the gate insulation layer 209, wherein, during the patterning process, the capping layer 230 may also be patterned, which may have been used as an anti-reflective coating (ARC) layer, a hard mask layer and the like. Next, a liner material may be conformally deposited on the basis of plasma enhanced chemical vapor deposition (PECVD) followed by the deposition of a spacer layer, which is then patterned by an anisotropic etch process, thereby obtaining the spacer 231. Thereafter, the exposed residuals of the liner 232 may be removed and then the device 200 may be subjected to an anisotropic etch process 233 for forming a respective cavity or recess adjacent to the encapsulated gate electrode 208.

Figure 2B:
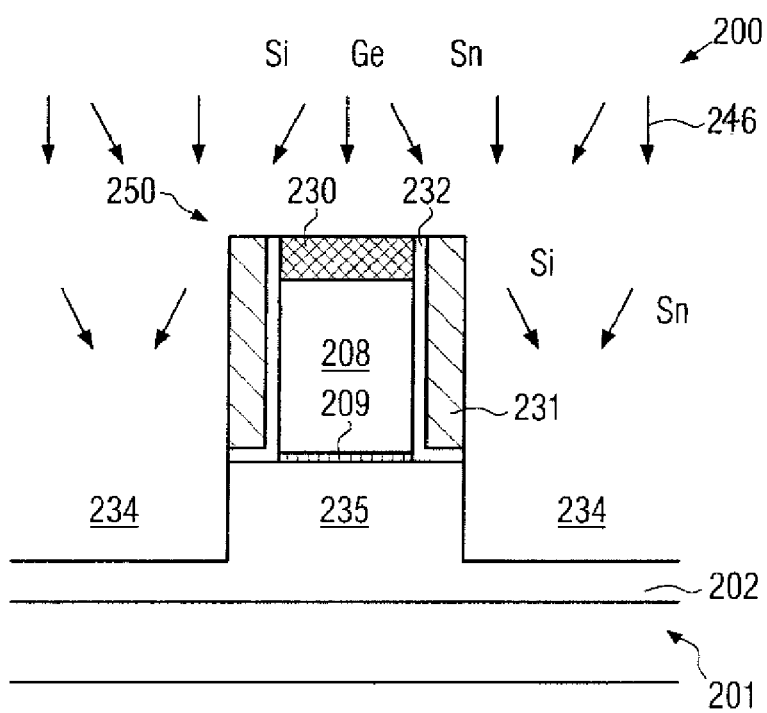

FIG. 2b schematically shows the semiconductor device 200 in a further advanced manufacturing stage, wherein a recess or cavity 234 is formed after the completion of the anisotropic etch process 233. Next, the device 200 may be subjected to any pretreatments for preparing the device 200 for a subsequent selective epitaxial growth process. For instance, appropriate cleaning processes may be performed to remove contaminants and etch byproducts from exposed surfaces of the device 200. Thereafter, a selective epitaxial growth process 246 may be performed, wherein, in one illustrative embodiment, an appropriate deposition atmosphere may be established on the basis of a silicon-containing precursor material, a germanium-containing precursor material, and a precursor including an atomic species having the same valence as silicon and germanium and exhibiting an increased covalent radius compared to germanium. In one illustrative embodiment, the deposition ambient may be created on the basis of tin hydride ($SnH_4$) to provide a desired concentration of tin within the deposition atmosphere of the process 246. As previously explained, typically, in selective epitaxial growth processes, the process parameters, such as pressure, temperature, type carrier gases and the like, are selected such that substantially no material is deposited on dielectric surfaces, such as surfaces of the capping layer 230 and the spacers 231, while a deposition is obtained on exposed surfaces of the crystalline layer 202, thereby using this layer as a crystalline template, which substantially determines the crystalline structure of the epitaxially grown material. In this illustrative embodiment, the material grown within at least a portion of the recess 234 is to be provided as a strained material, i.e., the material should exhibit the same crystalline structure and, thus, substantially the same lattice spacing as the basic template of the layer 202, which results in a highly strained material region due to the presence of germanium and a further atomic species having an increased covalent radius, such as tin. Consequently, due to the presence of strained crystalline material, a corresponding strain is also created in a channel region 235 located adjacent to the recess 234.

As previously explained, due to the enhanced covalent radius of tin with respect to silicon and germanium, a significantly reduced amount of non-silicon atoms may be sufficient to achieve a corresponding strained semiconductor material during the epitaxial growth process 246. Consequently, a moderately low concentration of, for instance, tin within the deposition atmosphere in the range of approximately 0.1-10% may be considered appropriate for creating the required strain. In other embodiments, the deposition atmosphere of the process 246 may be established on the basis of silicon and the at least one further atomic species having the increased covalent radius, such as tin, substantially without adding any germanium, thereby providing enhanced design flexibility when the influence of a substantial amount of germanium may be considered inappropriate with respect to other electrical characteristics, such as leakage current of PN junctions and the like. During the epitaxial growth process 236, a concentration of tin and/or germanium and thus of silicon may be controlled in any appropriate manner. For example, in some cases, it may be appropriate to locate the tin atoms more closely to an upper surface of the drain and source regions still to be formed due to a different diffusion behavior of tin compared to germanium in subsequent high temperature processes in the further processing of the device 200. In other illustrative embodiments, the tin may be provided in the vicinity of areas in which a metal silicide is to be subsequently formed, wherein the significantly reduced amount of tin atoms may provide increased flexibility in creating the metal silicide, compared to a corresponding device that would require a significantly increased germanium content for creating the same amount of strain, which may, however, impose significant restrictions with respect to the subsequent silicidation process. In still other embodiments, a final silicon layer may be formed on top of the strained silicon/germanium/tin layer or the silicon/tin layer formed by the epitaxial growth process 246.

Figure 2C:
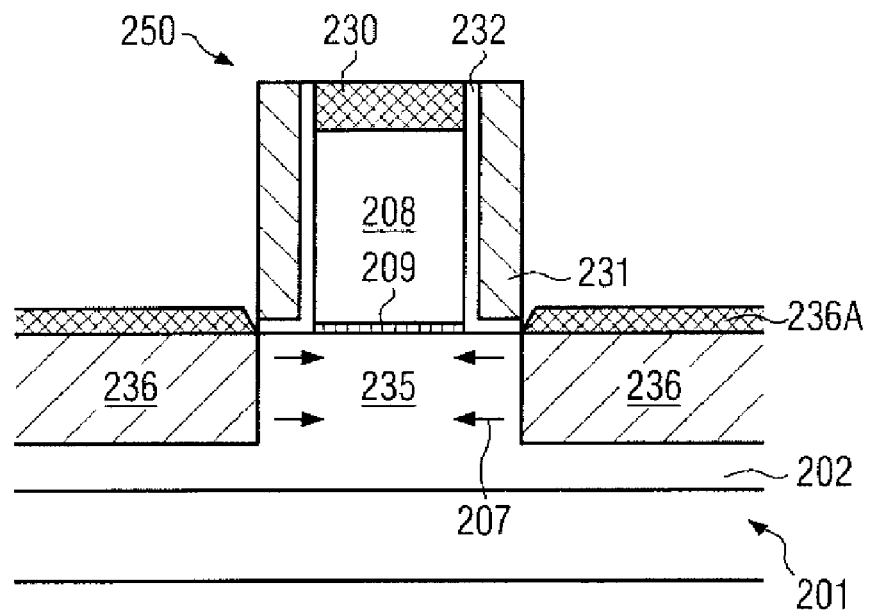

FIG. 2c schematically shows the semiconductor device 200 after the completion of the epitaxial growth process 236. Hence, the device 200 comprises a recessed strained semiconductor region 236 having a crystalline structure that corresponds to the diamond-structure of the silicon-based layer 202. Due to the lattice mismatch, as the natural lattice spacing of the crystalline structure in the region 236 is larger than a regular silicon spacing, a compressive strain 207 is generated in the channel region 235, thereby providing an enhanced mobility for holes during the operation of the transistor 250. Moreover, due to the partial or complete substitution of germanium by an atomic species having an enlarged covalent radius, such as tin, a significantly increased value for the strain 207 may be obtained on the basis of a concentration of non-silicon atoms in the region 236 that is well below a limit for conglomeration, as is previously encountered in conventional devices, when a high germanium content is used. However, as previously explained, the germanium and/or tin concentration within the region 236 may vary in the depth direction to account for various device requirements. For instance, in the embodiment shown, a specific "overgrowth" may have been formed to enhance a subsequent silicidation process, thereby reducing the resulting contact resistance. Moreover, an upper region of the epitaxially grown material 236, indicated as 236A, may be provided, which may have a reduced germanium concentration while still providing a high degree of strain by correspondingly increasing the tin concentration, which may, however, still be significantly less compared to a silicon/germanium region producing the same amount of strain 207, thereby allowing enhanced flexibility in selecting appropriate refractory metals for the subsequent silicidation process. It should be appreciated that any other appropriate variation in the germanium and/or tin concentration within the region 236 may be created during the preceding epitaxial growth process.

Thereafter, the spacers 231 and the capping layer 230 may be removed, possibly after any implantation processes for forming drain and source regions, when the spacers 231 have appropriate dimensions for obtaining the desired lateral profile, at least of a part of the drain and the source regions. In other cases, the spacers 231 and the capping layer 230 may be removed and a conventional process sequence may be carried out to form spacer elements with intermediate implantation processes for obtaining the required complex lateral profiling of the drain and source region defined by design rules.

Figure 2D:
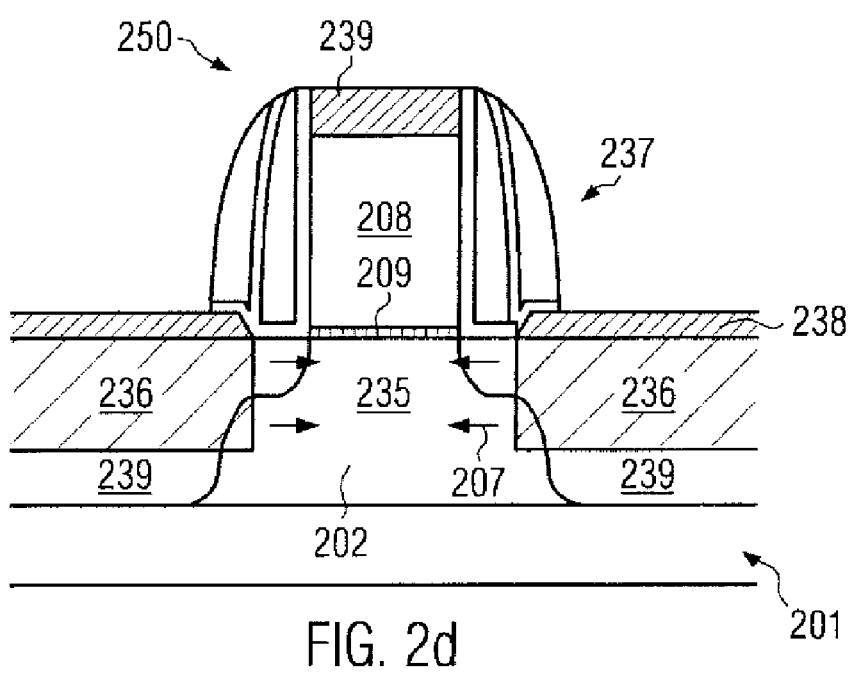

FIG. 2d schematically shows the semiconductor device 200 at an advanced manufacturing stage, in which the transistor 250 is substantially finished. Thus, the device 200 comprises a sidewall spacer structure 237, which may include a plurality of individual spacer elements separated by respective liners. Moreover, a drain and source region 239 has a specified lateral dopant profile in accordance with device requirements. Moreover, metal silicide regions 238 may be formed on the drain and source regions 239 and a corresponding metal silicide region 239 may be formed in the gate electrode 208. Consequently, the channel region 235 may be compressively strained due to the strain 207 created by the region 236, thereby significantly enhancing the drive current capability of the transistor 250, which may represent a P-channel transistor. Due to the provision of the atomic species having the increased covalent radius in the region 236, a significant increase of the strain 207 may be achieved compared to conventional devices including an embedded silicon/germanium region.

Moreover, by appropriately designing the germanium and/or tin concentration in the region 236, an enhanced flexibility in forming the metal silicide regions 238 may be provided. For example, a highly conductive nickel silicide may be formed in the region 238 by reducing the germanium content at least in the upper portion 236A while nevertheless providing enhanced strain by correspondingly increasing the tin concentration. Consequently, a significant gain in performance may be obtained while nevertheless a high degree of compatibility with conventional processes for forming embedded silicon/germanium semi-conductor structures may be maintained and an additional freedom in the design may be obtained. For this purpose, a corresponding epitaxial growth process may be adapted to include the provision of appropriate precursor material such as tin hydride ($SnH_4$), on the basis of which an appropriate and desired incorporation of non-silicon atoms may be achieved, which allows efficient control of the created strain substantially without creating any stress relief by phase segregation and crystal slips inside the strained semiconductor region 236.

Figure 3:
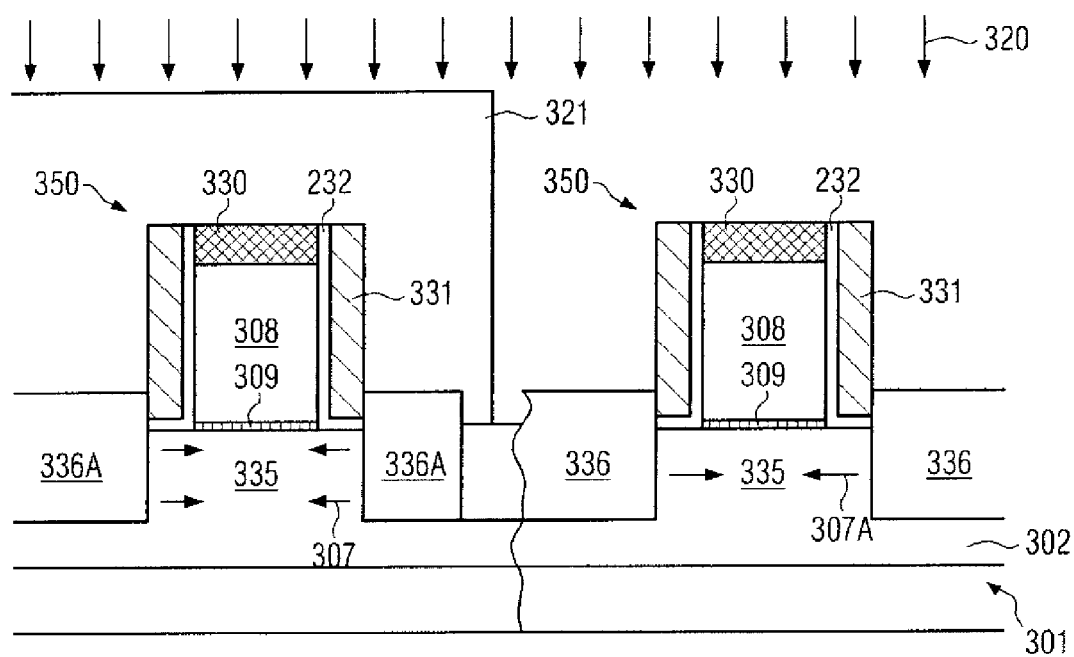
FIG. 3 schematically illustrates a cross-sectional view of a semiconductor device comprising different transistor elements that receive a different amount of tin for creating a different magnitude of strain in accordance with still another illustrative embodiment of the present invention.

FIG. 3 schematically shows a cross-sectional view of a semiconductor device 300 in accordance with still other embodiments. The semiconductor device 300 comprises a first transistor 350 and second transistor 360 formed above a substrate 301 on the basis of a crystalline semiconductor layer 302. With respect to the substrate 302 and the semiconductor layer 302, the same criteria apply as previously explained with reference to the components 101, 102, 201 and 202. Moreover, in the embodiment illustrated, the transistors 350, 360 may have encapsulated gate electrodes 308 and formed adjacent thereto corresponding raised semiconductor regions 336, 336A. In other illustrative embodiments (not shown), the raised regions 336, 336A may not be provided and may merely represent a portion of the crystalline semiconductor layer 302.

The device 300 as shown in FIG. 3 may be formed in accordance with a process strategy as is previously described with reference to FIGS. 2a-2b, wherein, however, the transistors 350, 360 may represent transistors that may receive a different magnitude of strain, since these transistors may represent transistors at different die regions or may represent transistors of different conductivity type. For example, the first transistor 350 may represent a P-channel transistor while the transistor 360 may represent an N-channel transistor. Consequently, during a corresponding etch process for forming respective cavities or recesses to accommodate the semiconductor regions 336, 336A, an enhanced process uniformity may be achieved since the etch process may not require any hard masks to completely cover one transistor type, while exposing the other. Similarly, in the subsequent epitaxial growth process, an enhanced degree of uniformity may be achieved across the substrate 301 due to the reduction of any loading effects that may also be an issue in conventional techniques, in which one transistor type is to be completely covered while the other type is exposed. During the corresponding epitaxial growth process for forming the raised semiconductor regions 336, 336A, a small amount of germanium and/or tin may be incorporated to provide a "basic" strain 307 that is compatible with the performance of, for instance, the second transistor 360. In other illustrative embodiments, when the basic strain 307 is considered inappropriate, a corresponding cavity etch and a subsequent epitaxial growth process may be omitted. In other cases, the transistor 360 may represent a P-channel transistor in a critical device region, such as a static RAM area, which may receive a reduced amount of strain 307, while the transistor 350 may require an increased strain.

In one illustrative embodiment, an implantation process 320 may be performed, during which the first transistor 350 is exposed while the second transistor 360 may be covered by a resist mask 321. During the implantation 320, tin may be implanted into the region 336, thereby increasing the tin concentration therein, which may lead to a desired increase of strain due to the increased covalent radius of tin generating a lattice distortion more efficiently. Since a high concentration in terms of implantation induced concentrations may be required, such as approximately $10^{20}$ atoms/cm$^3$ or even more, the region 336 may be substantially amorphized during the implantation 320. Consequently, an anneal process may be performed to re-crystallize the substantially amorphized portion 336 on the basis of the crystalline template 302, thereby forming a highly strained crystal structure in the region 336. As a consequence, the initially present strain 307 may be increased to a value 307A to thereby obtain the required mobility gain in the transistor 350. Thereafter, the further processing for completing the transistors 350 and 360 may be continued as is previously described with reference to FIGS. 2a-2d.

In other illustrative embodiments, the implantation process 320 may be performed without a preceding formation of the regions 336, 336A, when the creation of the strain 307A obtained by a concentration achieved by the implantation 320 is considered appropriate. For example, in highly sensitive device regions, a strain engineering on the basis of a strained semiconductor material may not be inappropriate for N-channel transistors, while a "mild" strain in the channel region of PMOS transistors may be desirable. In this situation, the implantation sequence 320 may be applied prior to the formation of any drain and source regions, wherein, in one embodiment, additionally the implantation 320 may be performed as a pre-amorphization implantation to enhance the subsequent dopant introduction for forming the drain and source regions. Consequently, a highly selective performance improvement may be achieved with a high degree of compatibility with existing process techniques substantially without grossly affecting the N-channel transistors.

As a result, the present invention provides an improved technique for the formation of strain by means of strained or relaxed semiconductor material in that an atomic species, such as tin, having greater covalent radius compared to germanium is incorporated into respective crystalline silicon-based semiconductor layers, thereby significantly reducing the risk for stress relief due to conglomeration and lattice defects. In illustrative embodiments, the atomic species having the increased covalent radius may be incorporated by an epitaxial growth process on the basis of an appropriate precursor material, such as tin hydride ($SnH_4$). Moreover, by incorporating the atomic species by other techniques, such as implantation, a highly localized strain engineering may be accomplished, thereby offering high flexibility for process and product design.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:

forming, in a crystalline semiconductor layer comprising silicon, a crystalline structure on the basis of silicon and at least one further atomic species having a covalent radius that is greater than a covalent radius of germanium in contact with the crystalline semiconductor layer; and using said crystalline structure to create strain in a first specified region of said semiconductor layer.

2. The method of claim 1, wherein forming said crystalline structure comprises epitaxially growing said silicon and said at least one further atomic species using said crystalline semiconductor layer as a growth template.

3. The method of claim 2, wherein epitaxially growing said silicon and said at least one further atomic species is based on a precursor comprising tin and hydrogen.

4. The method of claim 3, wherein said precursor is comprised of tin hydride.

5. The method of claim 1, wherein forming said crystalline structure comprises depositing said silicon and said at least one further atomic species in a substantially amorphous form and re-crystallizing said silicon and said at least one further atomic species using said crystalline semiconductor layer as a crystalline template.

6. The method of claim 1, wherein forming said crystalline structure comprises implanting said at least one further atomic species into a first portion of said crystalline semiconductor layer and re-crystallizing said portion using said crystalline semiconductor layer as a crystalline template.

7. The method of claim 6, further comprising forming a silicon/germanium crystal in said structure and implanting said at least one further atomic species to adjust the amount of strain in said first region.

8. The method of claim 6, further comprising implanting said at least one further atomic species into a second portion so as to create a second strain in a second specified region of said crystalline semiconductor layer, said second strain differing from said first strain.

9. The method of claim 1, further comprising forming a gate electrode above said crystalline semiconductor layer, wherein said crystalline structure is formed with a lateral offset to said gate electrode.

10. The method of claim 9, further comprising forming a recess adjacent to said gate electrode and forming at least a portion of said crystalline structure within said recess.

11. The method of claim 1, wherein said crystalline semiconductor layer comprises a buffer layer comprising silicon and at least a first atomic species other than silicon.

12. A method, comprising:

forming, in a crystalline semiconductor layer, a crystalline structure on the basis of silicon and at least one further atomic species having a covalent radius that is greater than a covalent radius of germanium by implanting said at least one further atomic species into a first portion of said crystalline semiconductor layer and re-crystallizing said portion using said crystalline semiconductor layer as a crystalline template; and using said crystalline structure to create strain in a first specified region of said semiconductor layer.

13. A method, comprising:

forming, in a crystalline semiconductor layer, a crystalline structure on the basis of silicon and at least one further atomic species having a covalent radius that is greater than a covalent radius of germanium by depositing said silicon and said at least one further atomic species in a substantially amorphous form and re-crystallizing said silicon and said at least one further atomic species using said crystalline semiconductor layer as a crystalline template; and using said crystalline structure to create strain in a first specified region of said semiconductor layer.

14. The method of claim 13, further comprising forming a silicon/germanium crystal in said structure and implanting said at least one further atomic species to adjust the amount of strain in said first region.

15. The method of claim 13, further comprising implanting said at least one further atomic species into a second portion so as to create a second strain in a second specified region of said crystalline semiconductor layer, said second strain differing from said first strain.

16. A transistor device, comprising:

a first layer comprising silicon;

a crystalline semiconductor layer in contact with said first layer and having a diamond-like crystalline structure, said crystalline semiconductor layer comprising a stress-inducing region being comprised of silicon and a further atomic species having the same valence as silicon in said crystalline structure and having a covalent radius that is greater than a covalent radius of germanium;

a gate electrode formed above said crystalline semiconductor layer; and a strained channel region.

17. The transistor device of claim 16, wherein said stress-inducing region is formed in a drain and source region.

18. The transistor device of claim 16, wherein said stress-inducing region is said strained semiconductor material so as to generate compressive strain in said channel region.

19. The transistor device of claim 16, wherein said stress-inducing region comprises tin.

20. The transistor device of claim 19, wherein said stress-inducing region comprises germanium.

21. The device of claim 16, wherein the first layer comprises a buffer layer comprising silicon and at least a first atomic species other than silicon.

* * * * *